(12) United States Patent
Smith et al.

(10) Patent No.: US 10,374,752 B2
(45) Date of Patent: Aug. 6, 2019

(54) METHODS AND SYSTEMS FOR DATA TRANSMISSION

(71) Applicant: INPHI CORPORATION, Santa Clara, CA (US)

(72) Inventors: Benjamin Smith, Ottawa (CA); Jamal Riani, Fremont, CA (US); Arash Farhoodfar, Sunnyvale, CA (US); Sudeep Bhoja, San Jose, CA (US)

(73) Assignee: INPHI CORPORATION, Santa Clara, CA (US)

(*) Notice: Subject to any disclaimer, the term of this patent is extended or adjusted under 35 U.S.C. 154(b) by 63 days.

(21) Appl. No.: 15/693,294

(22) Filed: Aug. 31, 2017

(65) Prior Publication Data
US 2019/0068322 A1    Feb. 28, 2019

(51) Int. Cl.
*H04L 1/00* (2006.01)
*H03M 13/19* (2006.01)
*H04L 1/06* (2006.01)
*H04L 27/26* (2006.01)

(52) U.S. Cl.
CPC .......... *H04L 1/0057* (2013.01); *H03M 13/19* (2013.01); *H04L 1/0041* (2013.01); *H04L 1/0059* (2013.01); *H04L 1/0064* (2013.01); *H04L 1/0071* (2013.01); *H04L 1/0058* (2013.01); *H04L 1/0643* (2013.01); *H04L 27/2627* (2013.01)

(58) Field of Classification Search
CPC ... H04L 1/0071; H04L 1/0057; H04L 1/0058; H04L 27/2627; H04L 1/0064; H04L 1/0643; H04L 1/0041; H04L 1/0059; H03M 13/19
See application file for complete search history.

(56) References Cited

U.S. PATENT DOCUMENTS

| | | | |
|---|---|---|---|
| 2002/0054644 A1* | 5/2002 | Henry | G06T 9/007 375/240.27 |
| 2002/0108083 A1* | 8/2002 | Matsumoto | H03M 13/271 714/755 |
| 2005/0025498 A1* | 2/2005 | Ono | H04B 10/504 398/141 |
| 2005/0213499 A1* | 9/2005 | Boyce | H03M 13/373 370/222 |

(Continued)

*Primary Examiner* — April Y Blair
*Assistant Examiner* — Sazzad Hossain
(74) *Attorney, Agent, or Firm* — Richard T. Ogawa; Ogawa P.C.

(57) ABSTRACT

The present invention relates to data communication systems and methods thereof. More specifically, embodiments of the present invention provide a data transmission method. Data are encoded with staircase encoder, and staircase coded blocks are first interleaved then combined into outer code frames. Code frames additionally include sync words and padding bits. A second interleaving is applied to the bits of the code frames, and Hamming encoding is performed on the output of the second interleaver. Hamming codewords are Gray-mapped to dual-polarized quadrature-amplitude-modulation (DP-QAM) symbols, and a third interleaving of the symbols from a set of successive Hamming codewords is performed. Pilot symbols are inserted periodically into the stream of DP-QAM symbols. There are other embodiments as well.

27 Claims, 10 Drawing Sheets

(56) References Cited

U.S. PATENT DOCUMENTS

| | | | |
|---|---|---|---|
| 2006/0120437 A1* | 6/2006 | Kang | H04B 1/7174 |
| | | | 375/146 |
| 2006/0136797 A1* | 6/2006 | Cai | H03M 13/3723 |
| | | | 714/752 |
| 2007/0149242 A1* | 6/2007 | Kim | H04J 11/004 |
| | | | 455/525 |
| 2009/0086839 A1* | 4/2009 | Xu | H03M 13/19 |
| | | | 375/262 |
| 2012/0148255 A1* | 6/2012 | Liu | H04B 10/50 |
| | | | 398/136 |
| 2013/0031437 A1* | 1/2013 | Farhoodfar | H03M 13/2707 |
| | | | 714/752 |
| 2013/0216221 A1* | 8/2013 | Zhang | H04L 1/0057 |
| | | | 398/43 |
| 2014/0237325 A1* | 8/2014 | Farhoodfar | H03M 13/15 |
| | | | 714/782 |
| 2015/0039965 A1* | 2/2015 | Fonseka | H03M 13/275 |
| | | | 714/756 |
| 2015/0155967 A1* | 6/2015 | Kim | H04L 1/0042 |
| | | | 375/295 |
| 2015/0229329 A1* | 8/2015 | Yamada | H03M 7/6023 |
| | | | 714/759 |
| 2016/0087753 A1* | 3/2016 | Ran | H04L 1/0057 |
| | | | 714/776 |
| 2016/0218813 A1* | 7/2016 | Farley | H04B 10/6162 |
| 2017/0070298 A1* | 3/2017 | Elgala | H04L 27/2697 |
| 2017/0117970 A1* | 4/2017 | Wilkinson | H04B 10/70 |
| 2017/0134052 A1* | 5/2017 | Oh | H04N 21/4382 |

* cited by examiner

METHODS AND SYSTEMS FOR DATA TRANSMISSION

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates to data communication systems and methods thereof.

Internet and mobile applications nowadays demand a huge amount of bandwidth for transferring photo, video, music, and other multimedia files. To meet the bandwidth and capacity demands, high-speed data communication systems are deployed. Research and development efforts have been made to improve bandwidth of optical communication systems. For example, given physical limitations of optical communication links, advanced techniques (e.g., high-order QAM, DSP processing, etc.) are used to reach high data rate (e.g., 400 Gbps).

BRIEF SUMMARY OF THE INVENTION

The present invention relates to data communication systems and methods thereof. More specifically, embodiments of the present invention provide a data transmission method. Data are encoded with staircase encoder, and staircase coded blocks are first interleaved then combined into outer code frames. Code frames additionally include sync words and padding bits. A second interleaving is applied to the bits of the code frames, and Hamming encoding is performed on the output of the second interleaver. Hamming codewords are Gray-mapped to dual-polarized quadrature-amplitude-modulation (DP-QAM) symbols, and a third interleaving of the symbols from a set of successive Hamming codewords is performed. Pilot symbols are inserted periodically into the stream of DP-QAM symbols. There are other embodiments as well.

According to an embodiment, the present invention provides a method for data transmission. The method includes receiving a data stream. The method also includes performing staircase forward error correction (FEC) to encode the data stream and generate a plurality of staircase coded blocks. The method further includes generating outer code frames. Each of the outer code frames includes a coded section and an uncoded section. The method further includes interleaving the staircase coded blocks into coded sections of the outer code frames. Each of the coded section comprises a plurality of staircase blocks. The method additionally includes interleaving the outer code frames to interleaved units with a predetermined size. The method also includes performing Hamming encoding to generate Hamming codewords. The Hamming codewords are spaced by the interleaved units to form concatenated data. The method also includes mapping the concatenated data to quadrature-amplitude modulation (QAM) data symbols. The method also includes interleaving mapped Hamming codewords in a round-robin order into the QAM data symbols. The method further includes inserting pilot symbols into the QAM data symbols.

According to another embodiment, the present invention provides a transmitting apparatus. The apparatus includes a staircase (SC) encoder for processing a data stream and generating staircase coded blocks. The apparatus also includes a framing circuit for generating code frames. Each of the code frames has a coded section and an uncoded section. The apparatus also includes a first interleaving circuit for distributing staircase coded blocks into the coded sections of the code frames. The apparatus also includes a second interleaving circuit for spreading code frames into interleaved units. The apparatus also includes a Hamming encoder for generating Hamming codewords and inserting the Hamming codewords into interleaved units to form concatenated data. The apparatus further includes a mapping circuit for mapping the concatenated data into QAM symbols. The Hamming codewords are mapped into Hamming QAM symbols. The apparatus also includes a third interleaving circuit for distributing the Hamming QAM symbols. The apparatus also includes a pilot symbol circuit for generating pilot symbols and inserting pilot symbols into the QAM symbols. The pilot symbols are synchronized with Hamming QAM symbols.

According to yet another embodiment, the present invention provides a transmitting apparatus, which includes a communication interface for receiving a data stream. The apparatus also includes an alignment circuit for aligning the data stream. The apparatus further includes a Reed-Solomon (RS) decoder for removing RS code from the data stream. The apparatus also includes a staircase (SC) encoder for processing data stream and generating staircase coded blocks. The apparat us further includes a framing circuit for generating code frames. Each of the code frames has a coded section and an uncoded section. The apparatus also includes a first interleaving circuit for distributing staircase coded blocks into the coded sections of the code frames. The apparatus also includes a second interleaving circuit for spreading code frames into interleaved units. The apparatus further includes a Hamming encoder for generating Hamming codewords and inserting the Hamming codewords into interleaved units to form concatenated data. The apparatus additionally includes a mapping circuit for mapping the concatenated data into QAM symbols. The apparatus also includes a third interleaving circuit for distributing the Hamming codewords into the QAM symbols.

It is to be appreciated that embodiments of the present invention provide many advantages over conventional techniques. By serially concatenating hard-decision-decodeable staircase coding and soft-decision-decodeable Hamming coding, data transmission systems according to the present invention can achieve both high data rate and low error rate. As explained below, combining staircase FEC and Hamming FEC with multiple interleavers significantly increases the tolerance of the system to burst errors, correlated phase noise, and polarization-dependent impairments.

Embodiments of the present invention can be implemented in conjunction with existing systems and processes. For example, interleaving circuits and FEC encoders described in the present invention can be implemented using existing manufacturing processes. Additionally, data transmission systems according to embodiments of the present invention can be readily adopted into existing communication systems and are compatible with various communication standards. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
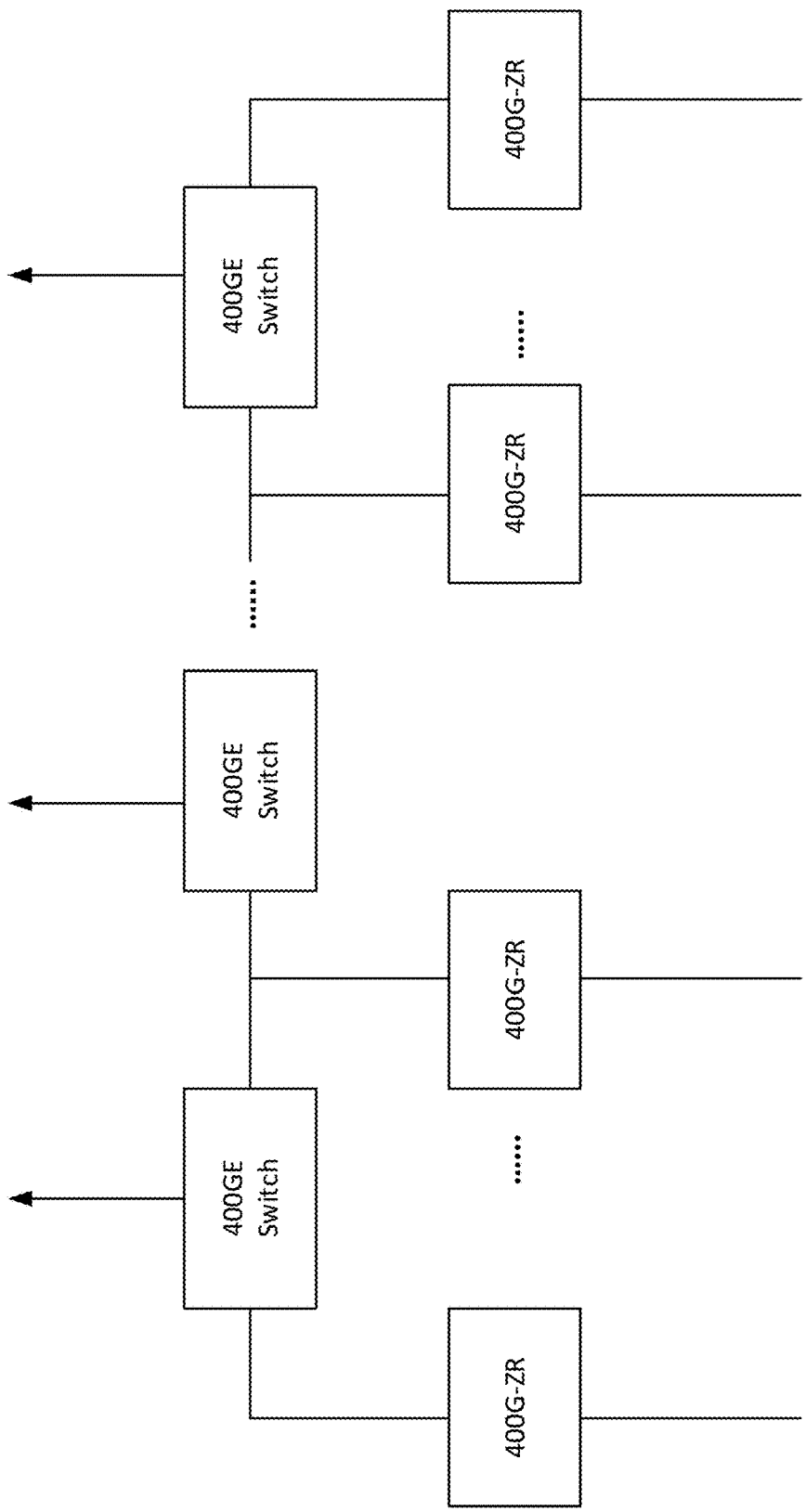
FIG. 1 is a simplified block diagram illustrating 400G-ZR transmitters used in a network application.

The present invention relates to data communication systems and methods thereof. More specifically, embodiments of the present invention provide a data transmission method. Data are encoded with staircase encoder, and staircase coded blocks are first interleaved then combined into outer code frames. Code frames additionally include sync words and padding bits. A second interleaving is applied to the bits of the code frames, and Hamming encoding is performed on the output of the second interleaver. Hamming codewords are Gray-mapped to dual-polarized quadrature-amplitude-modulation (DP-QAM) symbols, and a third interleaving of the symbols from a set of successive Hamming codewords is performed. Pilot symbols are inserted periodically into the stream of DP-QAM symbols. There are other embodiments as well.

As mentioned above, to achieve high data rate (e.g., 100 Gbps and higher), advanced data processing techniques are often used. In various embodiments, the present invention provides data transmission systems that use advanced forward error correction (FEC) mechanisms, inner interleaving techniques, and/or pilot symbols. Certain embodiments of the present invention are specifically implemented in accordance with 400G-ZR standard of the Optical Internetworking Forum (OIF).

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified block diagram illustrating 400G-ZR transmitters used in a network application. The 400G-ZR transmitters as shown are coupled to 400GE switches. For example, 400G-ZR transmitters and 400GE switches are used in data centers and installed on rack units. For example, the 400GE switches can demand 12.8 Tbps throughout per rack unit (RU). When deployed with 400GE switches, the 400G-ZR transmitters are configured in form factors (e.g., COBO, OSFP, QSFP-DD, etc.) that support the density of 12.8 Tbps per RU.

It is to be appreciated that embodiments of the present invention can readily satisfy the requirements of 400G-ZR standard and other relevant standards and applications. For example, optical transmitters according to embodiments of the present invention are implemented as coherent systems that support advanced modulation formats (e.g., QPSK, 8QAM, 16QAM, 64QAM, etc.). As the modulation level and symbol rate increase, the requirements in terms of bandwidth, resolution and amplification gain become more stringent. Fortunately, with optimized digital signal processing (DSP) functionalities at both the transmitter side and the receiver side, physical requirements in the transmitter and receiver chain can be relaxed. For example, DSP functionalities include interleaved concatenated FEC, consisting of hard-decision-decodeable staircase outer encoding, soft-decision-decodeable Hamming code for inner encoding, pilot symbols for synchronizing Hamming codes. Multiple levels of interleaving are performed to address error correlation, burst errors, and phase noises.

Figure 2:
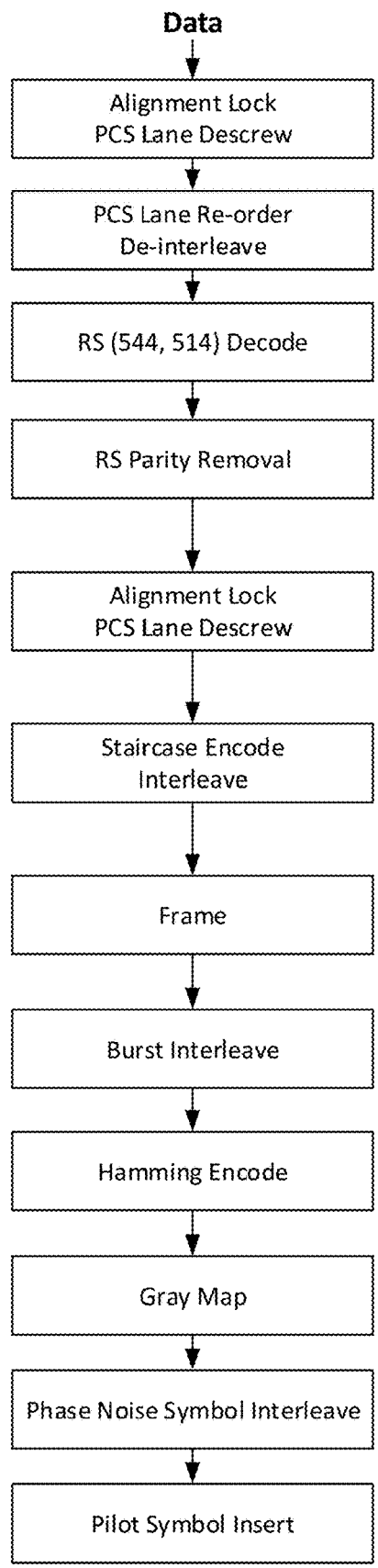
FIG. 2 is a simplified data flow diagram illustrating operation of a transmitter according to embodiments of the present invention.

FIG. 2 is a simplified data flow diagram illustrating operation of a transmitter according to embodiments of the present invention. This diagram is merely an example, which should not unduly limit the scope of the claims. One of ordinary skill in the art would recognize many variations, alternatives, and modifications. Incoming data, received through multiple communication lanes and/or multiplexer, are first aligned and de-skewed. For example, the incoming data could come from one or more data sources and might have been multiplexed. The transmitter then performs PCS lane re-ordering and de-interleaving. Next, Reed Solomon (RS) decoding is performed, followed by removal of RS parity bits. Staircase forward error correction (FEC) is performed to encode the data stream and generate a plurality of staircase coded blocks. Staircase coded blocks are interleaved into data stream using an error decorrelator. In various embodiments, staircase FEC is implemented for hard-decision outer encoding of the incoming data. A framing circuit frames interleaved staircase coded blocks into outer code frames.

Figure 3:
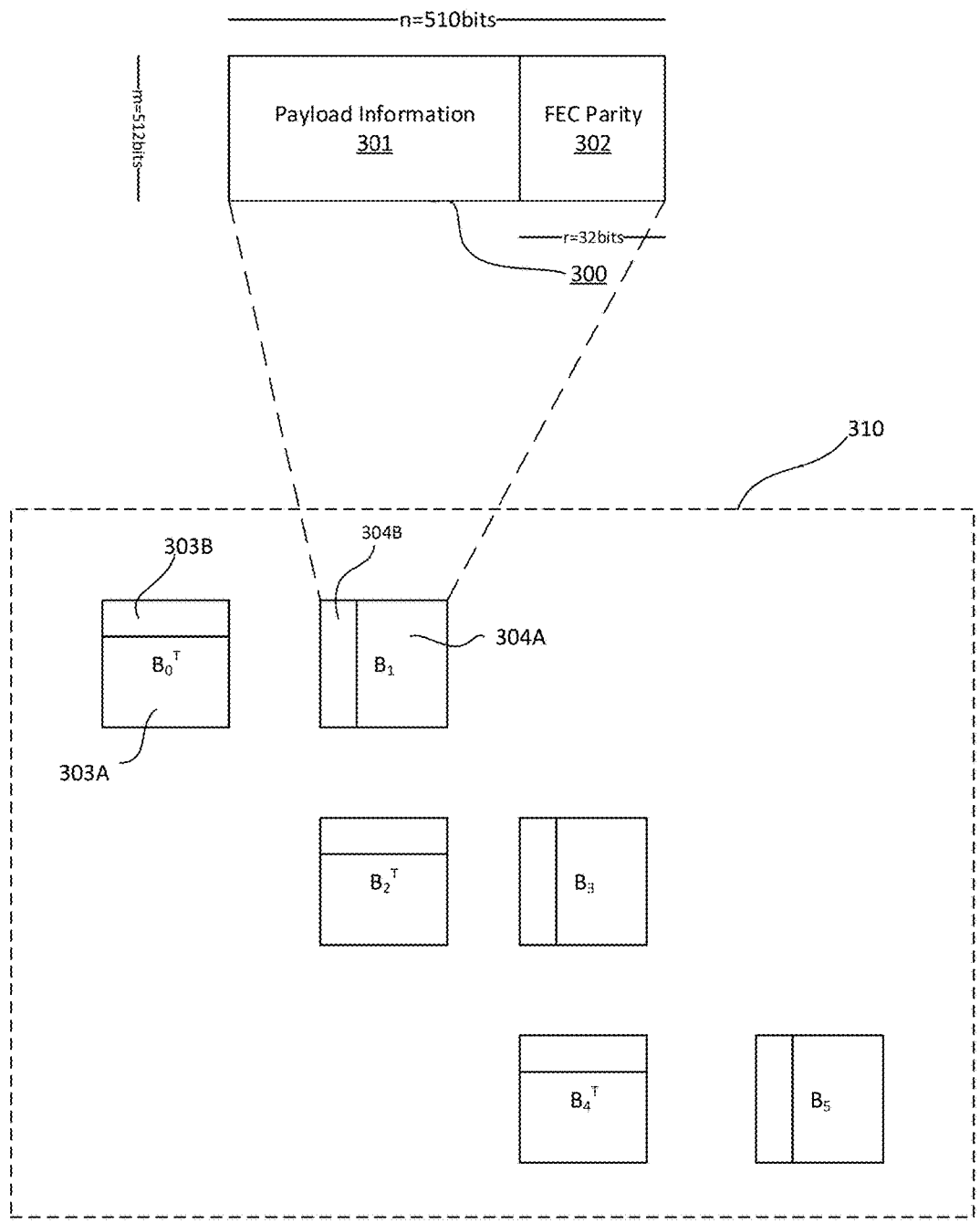
FIG. 3 is a simplified diagram illustrating the implementation of staircase encoding according to embodiments of the present invention.

FIG. 3 is a simplified diagram illustrating the implementation of staircase encoding according to embodiments of the present invention. This diagram is merely an example, which should not unduly limit the scope of the claims. One of ordinary skill in the art would recognize many variations, alternatives, and modifications. A staircase code is a block-wise recursively encoded forward error correction scheme. It can be considered a generalization of the product code construction to a family of variable latency codes, wherein the granularity of the latency is directly related to the size of the "steps", which are themselves connected in a product-like fashion to create the staircase construction. In staircase encoding, symbol blocks include data symbols and coding symbols. Data symbols in a stream of data symbols are mapped to a series of two-dimensional symbol blocks. The coding symbols could be computed across multiple symbol blocks in such a manner that concatenating a row of the matrix transpose of a preceding encoded symbol block with a corresponding row of a symbol block that is currently being encoded forms a valid code word of a FEC component code. For example, when encoding a second symbol block in the series of symbol blocks, the coding symbols in the first row of the second symbol block are chosen so that the first row of the matrix transpose of the first symbol block, the data symbols of the first row of the second symbol block, and the coding symbols of the same row of the second block together form a valid code word of the FEC component code.

With this type of relationship between symbol blocks, in a staircase structure that includes alternating encoded symbol blocks and matrix transposes of encoded symbol blocks, each two-block wide row along a stair "tread" and each two-block high column along a stair "riser" forms a valid codeword of the FEC component code. For example, a large frame of data can be processed in a staircase structure, and channel gain approaching the Shannon limit for a channel can be achieved. Low-latency, high-gain coding is possible. For 1.25 Mb to 2 Mb latency, for example, some embodiments might achieve a coding gain of 9.4 dB for a coding rate of 239/255, while maintaining a burst error correction capability and error floor which are consistent with other coding techniques that exhibit lower coding gains and/or higher latency.

Block 300 shows data block structure for SC FEC encoding. As shown, an SC data block includes a payload section 301 and FEC parity section 302. In a specific embodiment, SC block 300 is an m by n data matrix where n=510 bits and m=512 bits. For example, data blocks $B_j$ are characterized by the structure of block 300. Data blocks are organized into a staircase arrangement 310 as shown.

Consider the first two-block column that spans the first column of $B_1$ and the first column of $B_2^T$. The coding symbols for the first row of $B_2$ would be computed such that $[B_1^T B_{2,L} B_{2,R}]$ is a valid code word of FEC component code "C". Since the first column of $B_1$ would be the first row in $B_1^T$, and similarly the first column of $B_2^T$ would be the first row of $B_2$, the staircase structure 310 is consistent with the foregoing example coding symbol computation.

It can be seen that coding symbols for a block $B_i$ could be computed row-by-row using corresponding rows of $B_{i-1}^T$ and $B_i$, as described above. A column-by-column computation using corresponding columns of $B_{i-1}$ and $B_i^T$ would be equivalent. Stated another way, coding symbols could be computed for the coding symbol positions in each symbol block $B_i$, where i is a positive integer, in a sequence such that symbols at symbol positions along one dimension (row or column) of the two-dimensional symbol block $B_{i-1}$ in the sequence, concatenated with the information symbols and the coding symbols along the other dimension (column or row) in the symbol block $B_i$, form a code word of a FEC component code. In a staircase coded block, symbols at symbol positions along the one dimension (row or column) of the symbol block $B_i$ in the sequence, concatenated with the information symbols and the coding symbols along the other dimension (column or row) in the symbol block $B_{i+1}$, also form a code word of the FEC component code. For example, block $B_0^T$ has a payload section 303A for data and FEC section 303B for row code word. Block $B_1$ has a payload section 304A for data and FEC section 304B for column code word.

Figure 4:
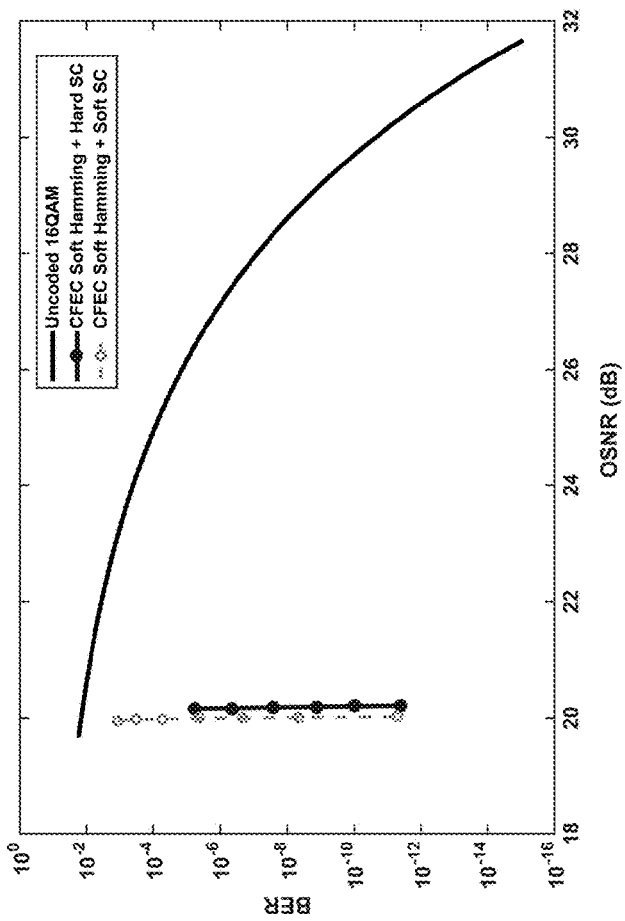
FIG. 4 is a graph illustrating performance of concatenated FEC according to embodiments of the present invention.

The SC based FEC as utilized in data transmission systems can provide a high level of performance. FIG. 4 is a graph illustrating performance of concatenated FEC according to embodiments of the present invention. For example, for the purpose of illustration, fixed point decoder performance is simulated. Implementations with soft Hamming decoding and hard staircase decoding shows a net coding gain of about 10.8 dB NCG, at 20.25 dB OSNR. Implementation with soft Hamming decoding and soft staircase decoding shows a net coding gain of about 11 dB, at 20.05 dB OSNR.

It is to be appreciated that while SC FEC can be implemented for different applications, embodiments of the present invention specifically utilize SC FEC for hard-decision outer encoding of data symbols. Staircase FEC is described in further detail in U.S. Pat. No. 8,751,910, entitled "STAIRCASE FORWARD ERROR CORRECTION CODING", issued 10 Jun. 2014, which is incorporated by reference herein.

Now referring back to FIG. 2. Data with staircase encoding are framed into code frame, and then burst interleaving (for addressing burst errors) is performed. For example, convolutional interleaving techniques are applied on the SC code frames for burst interleaving. Among other features, burst interleaving spreads the distribution of blocks of 119 bits of consecutive outputs from a single interleaved SC coded block to hamming codewords that are temporally separated in their transmission order, thereby spreading burst errors over SC coded blocks. Hamming encoding is performed after burst interleaving. For example, Hamming (128, 119) encoding scheme is used, but it is to be understood that other encoding schemes, such as Hamming (128, 120) encoding, can be used as well. Next, data are mapped to complex symbols, such as QAM16 symbols. A third interleaving process is performed on the mapped symbols to address phase noise symbols. For example, a four-way round-robin interleaving technique is used, which ensures that Hamming codewords see a uniform channel with respect to the unit intervals between pilot symbols. Each Hamming codeword is mapped to 16 DP-QAM16 symbols. Pilot symbols are inserted after the third interleaving process.

Figure 5:
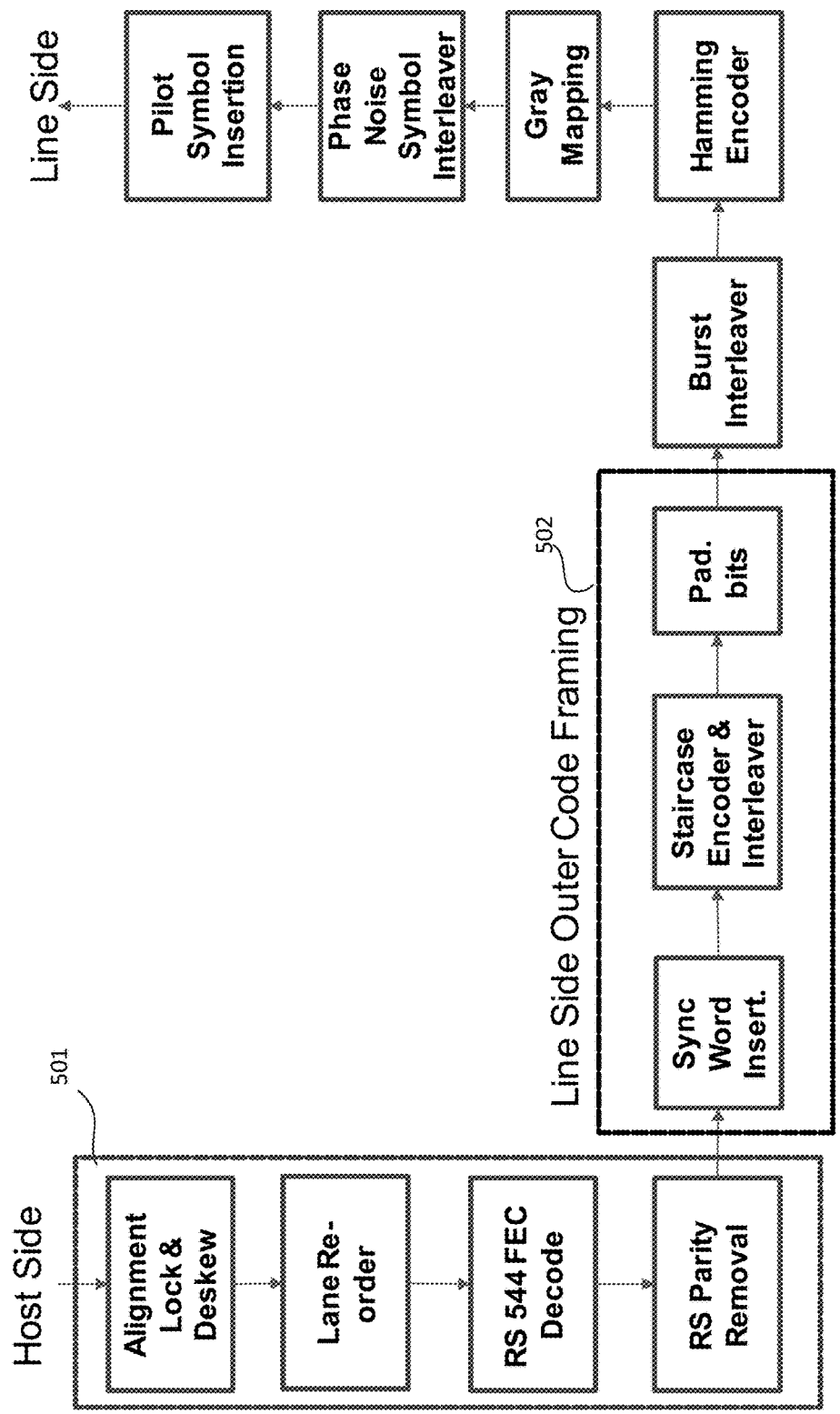
FIG. 5 is a simplified functional block diagram illustrating a data transmission apparatus according to embodiments of the present invention.

FIG. 5 is a simplified functional block diagram illustrating a data transmission apparatus according to embodiments of the present invention. This diagram is merely an example, which should not unduly limit the scope of the claims. One of ordinary skill in the art would recognize many variations, alternatives, and modifications. It is understood that the arrangement of the functional blocks and the processes performed by the functional blocks can be modified, rearranged, and/or overlapped. Functional blocks in FIG. 5 can be implemented using one or more DSP modules and circuits, and the data transmission apparatus may have other components that are not shown in FIG. 5. As an example, the data transmission apparatus is a part of an optical transmitter. The optical transmitter comprises additional components, such as laser source, optical modulator, driver circuit, optical interface, and others that are not here.

As explained above, data that is to be transmitted (i.e., received from the host side) are aligned and re-ordered. Reed Solomon (RS) FEC decoding and RS parity removal are also performed. For example, RS decoding and RS parity removal are performed by an RS decoder circuit. For example, data processing within block 501 may be implemented according to IEEE 802.3bs standard.

The data transmission apparatus illustrated in FIG. 5 performs both outer FEC encoding and inner FEC encoding. After RS parity removal, the data transmission apparatus generates outer code frames. For example, line side outer code framing is performed at block 502, which includes sync word insertion block, SC encoding block, and padding bits insertion block. For example, a framing circuit generates outer frames, inserts sync words and padding bits. In a specific embodiment, the SC encoding and interleaving block can be implemented in compliance with ITU G.709 standard. As a part of the encoding process, an error decorrelation (ED) interleaving process is performed to distribute SC codes. Among other things, ED interleaving randomizes the position of correlated errors with respect to staircase blocks. For example, ED interleaving is performed at the output of the SC encoder, and the ED interleaver serves as an error de-correlator to reduce the correlation of noise samples and the resultant data errors. In certain embodiments, interleaving of SC FEC code words is performed with time varying permutation. Interleaving with timing varying permutation is described in U.S. Pat. No. 8,601,340, entitled "TIME VARYING PERMUTATION APPARATUS AND METHODS", issued 9 Dec. 2014, which is incorporated by reference herein.

Figure 6:
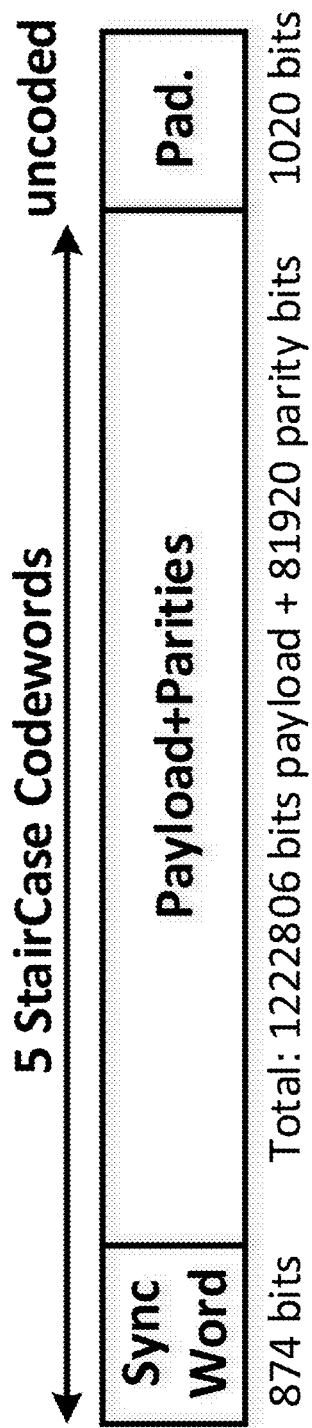
FIG. 6 is a simplified block diagram illustrating a code frame according to embodiments of the present invention.

FIG. 6 is a simplified block diagram illustrating a code frame according to embodiments of the present invention. This diagram is merely an example, which should not unduly limit the scope of the claims. One of ordinary skill in the art would recognize many variations, alternatives, and modifications. A line-side outer code frame includes three segments as shown. The sync word segment includes 874 bits. The sync word segment is inserted by the sync word insertion block in FIG. 5, and the sync word segment facilitates data synchronization. The payload data and parities are provided in the second segment. In a specific implementation, payload data include 257*4758=1222806 bits, and the parities include 81920 parity bits. The first segment and the second segment of the code frame constitute 5 SC code words. More specifically, SC FEC encoding is used to encode the first segment and the second segment of the code frame. After SC FEC encoding, padding bits (e.g., 1020 bits) is added to the third segment of the block structure. The third segment is not coded and is not associated with SC encoding. In certain applications, the padding bits can be encoded as well. It is to be understood depending on the implementation, framing format may be different. For example, to work with KP4 rate host interface in BT mode, the framing format can be implemented with a sync word length of 1680 and padding bits length of 530 bits to obtain a good line rate.

Depending on the implementation, other framing schemes can be used as well. Exemplary framing schemes are provided in Table 1 Below:

TABLE 1

| Baud Rate | No. of Codewords per frame | Sync Word length in bits | padding length in bits |
| --- | --- | --- | --- |
| 58.59375 | 4 | 31 | 1530 |
| 58.59375 | 8 | 62 | 3060 |
| 58.59375 | 5 | 874 | 1020 |
| 58.59375 | 9 | 905 | 2550 |
| 58.59375 | 13 | 936 | 4080 |
| 58.59375 | 6 | 1717 | 510 |
| 58.59375 | 10 | 1748 | 2040 |
| 58.59375 | 14 | 1779 | 3570 |
| 58.59375 | 7 | 2560 | 0 |
| 58.59375 | 11 | 2591 | 1530 |
| 58.59375 | 15 | 2622 | 3060 |
| 58.59375 | 12 | 3434 | 1020 |
| 58.59375 | 16 | 3465 | 2550 |
| 58.59375 | 20 | 3496 | 4080 |
| 58.90625 | 1 | 586 | 1156 |
| 58.90625 | 2 | 1172 | 2312 |
| 58.90625 | 3 | 1758 | 3468 |

Figure 7:
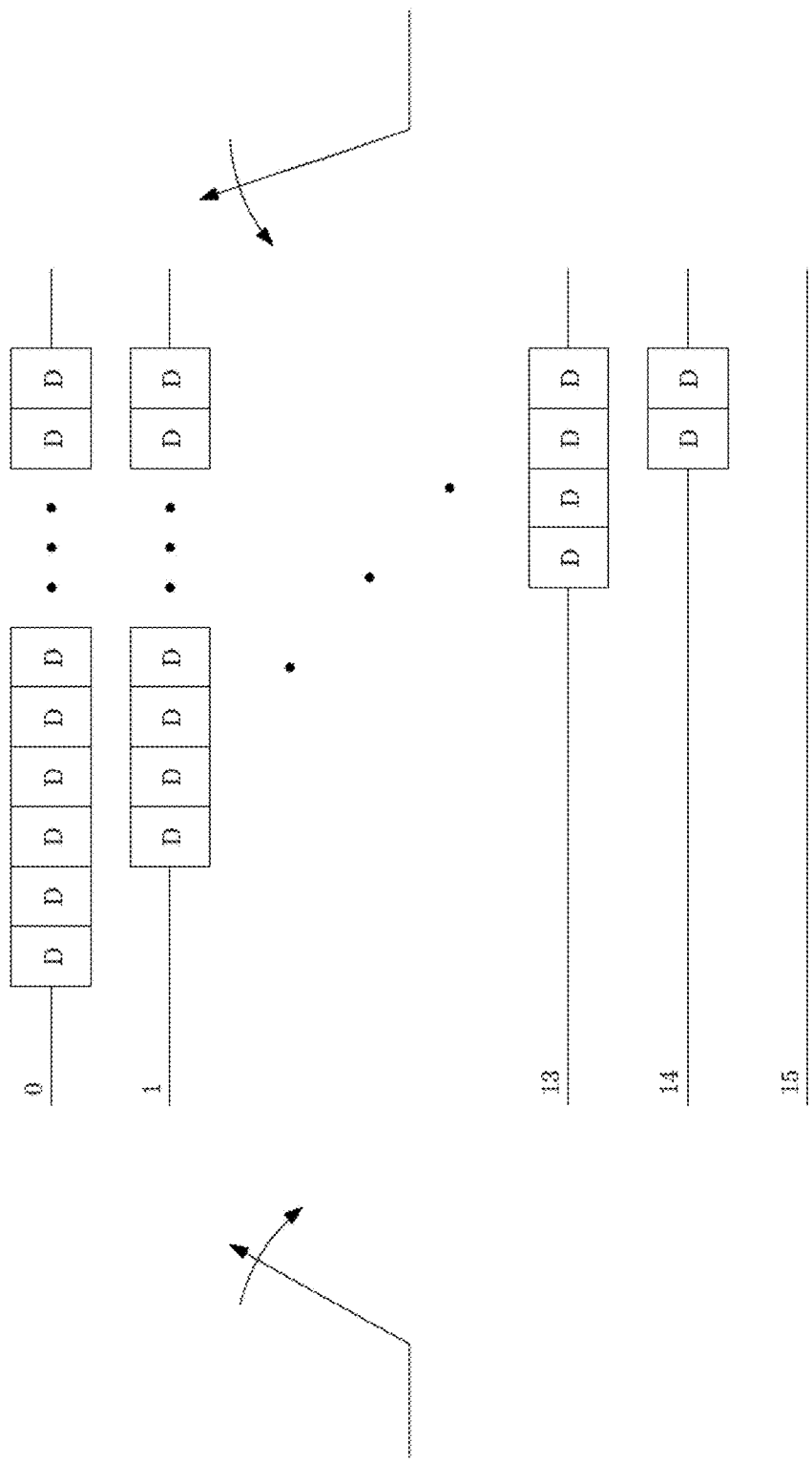
FIG. 7 is a simplified diagram illustrating a convolutional interleaver according to an embodiment of the present invention.

Now referring back to FIG. 5. Burst interleaving is performed on the code frames. As mentioned above, burst interleaver can be implemented using convolutional interleaving techniques. As shown in FIG. 5, a burst interleaver is configured between the Hamming encoding block and block 502, which transmits bits based on their order at the output of the error decorrelator/interleaver. For example, a basic unit of the convolutional interleaver is 119 bits (or 120 bits for a 128, 120 Hamming encoding scheme). In various embodiments, a convolutional interleaver is implemented as a 16-way interleaver. FIG. 7 is a simplified diagram illustrating a convolutional interleaver according to an embodiment of the present invention. This diagram is merely an example, which should not unduly limit the scope of the claims. One of ordinary skill in the art would recognize many variations, alternatives, and modifications. In FIG. 7, each delay operator "D" represents a storage element of 119b. From one row to the next, two delays operators are changed (e.g., added or removed). As an example, moving from row 0 to row 1, two delay operators are removed. In a specific implementation, the following steps are performed:

At time i, the switches are aligned at row b_i.
A block of 119b is read from row b_i.
The contents of row b_i are shifted to the right by 119b.
A block of 119b is written to row b_i.
The switch position is updated to b_(i+1)=b_i+1 (mod 16)

It is to be appreciated that other interleaving techniques can be used as well to address burst errors. As mentioned above, the burst interleaver spreads the distribution of 119b outputs from a single SC-ED block (of size about 2 kilo-bits) to hamming codewords that are temporally separated in their transmission order. By using burst interleaver, a burst of errors is limited to at most 119 bits in any SC-ED block.

Burst interleaving can be performed in other ways as well. In certain embodiments, both read and write operations (i.e., interleaving Hamming codewords and inserting pilot symbols) performed on the outer code framing are row-centric. There is no column access or column permutations for read and write operations. The locations of Hamming encoding are computed using predetermined formulae. To provide an example, consider a set of 512 consecutive blocks of 119b SC data, where SC FEC blocks are interleaved by an SC error de-correlator. Basic memory is an array of 512×128 bits. As explained above, an outer interleaver for SC encoder serves as an error de-correlator to reduce the correlation of noise samples and the resultant data errors. Encoded data blocks are identified with block index i, 0≤i≤511. Hamming encoder is used to encode the i-th block of bits 119 to 128 (Hamming 128, 119). The Hamming code word is to be inserted into j-th row of the 512×128 memory, where an exemplary formula for determining j is:

$$j=16\cdot(i \bmod 32)+15-\lfloor i/32 \rfloor$$

For example, evaluating the formula for j, the contents of the memory (row-by-row) correspond to the input index i as follows:

480, 448, 416, . . . 32,
0, 481, 449, . . . 33, 1,
482, 450, . . . 34, 2,
. . . ,
511, 479, . . . , 63, 31

An objective of the row-mapping scheme is to ensure that the bursts of errors do not have more than 128 bits corresponding to a single sub-block (of size about 2K) of the error de-correlator, since otherwise the decoding performance would be negatively affected. The term $15-\lfloor i/32 \rfloor$ in the formula for j takes care of the boundary case (at the end of a block of 512×128 and the start of the subsequent block of 512×128).

Figure 8:
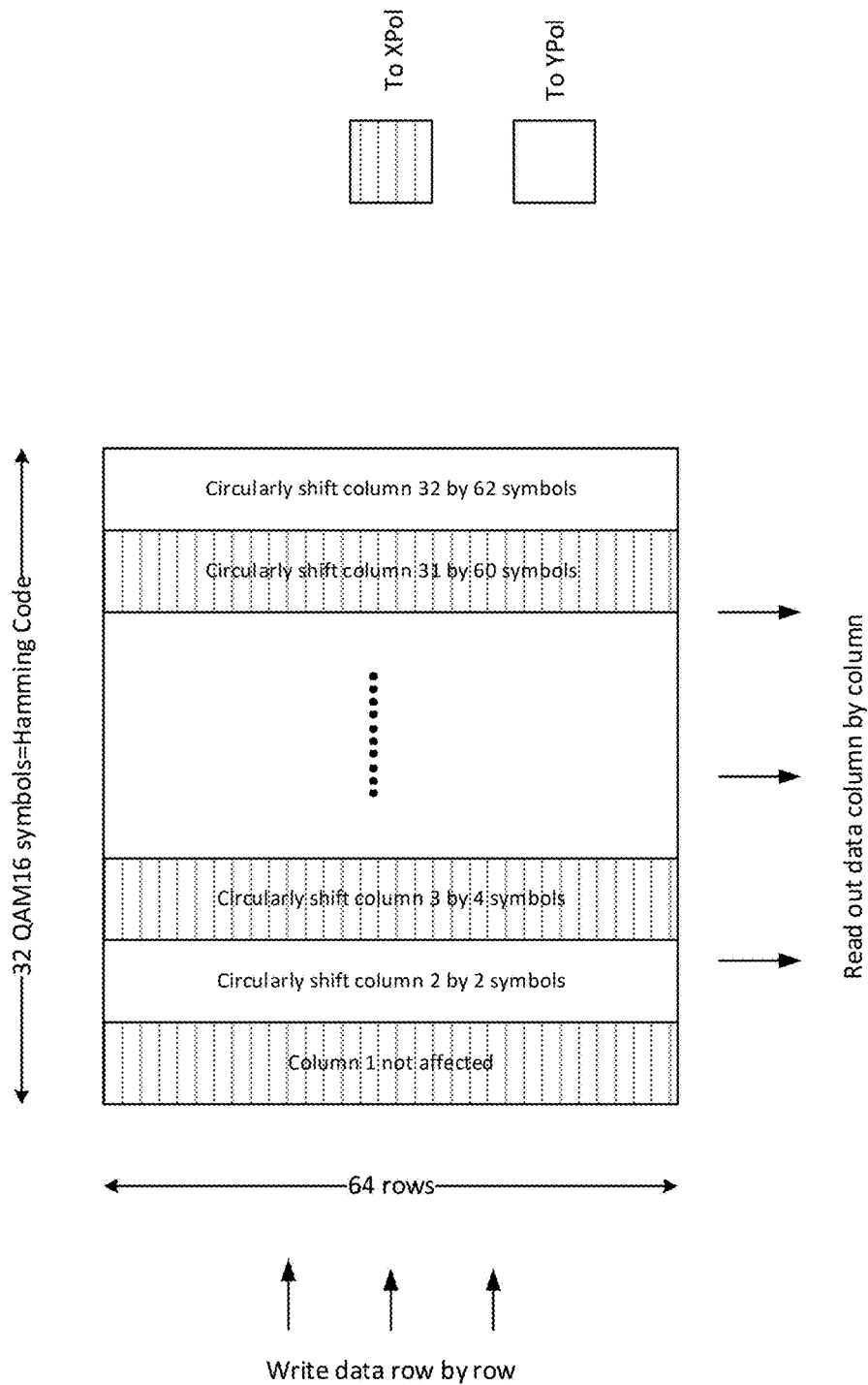
FIG. 8 is a block diagram illustrating alternative convolutional interleaver according to embodiments of the present invention.

FIG. 8 is a block diagram illustrating yet another alternative convolutional interleaver according to embodiments of the present invention. This diagram is merely an example, which should not unduly limit the scope of the claims. One of ordinary skill in the art would recognize many variations, alternatives, and modifications. Code frames generated by block 502 with SC encoding and ED interleaving are written row by row into data blocks of 64 rows and 32 columns. After mapping, Hamming codewords are later to be mapped to QAM16 symbols. For example, each Hamming codeword is mapped to 16 DP-QAM16 symbols. A total of 32 Hamming codewords are interleaved into 32 columns as shown.

For example, interleaving of Hamming codewords can be described as a circular distribution. Hamming codewords are not interleaved into fixed locations of columns, but at circularly shifted positions of columns (e.g., shifting by 2 positions similarly to processes illustrated in FIG. 7). As an example, column 1 is not affected, column 2 shifts by 2 symbols, column 3 shifts by 4 symbols, and so on. The data frame, with Hamming codewords interleaved, are accessed by reading out data column by column. Columns alternate between XPol component read out and YPol component read out. In FIG. 7, columns 1, 3, and 31 are for XPol readout, columns 2 and 32 are for YPol readout (columns between column 3 and column 31 not shown in FIG. 7).

After burst interleaving, Hamming encoding is performed. As explained above, Hamming encoding is implemented for soft-decision inner FEC encoding. For example, Hamming (128, 119) or Hamming (128, 120) codes are distributed into code frames generated by block 502 in accordance to the burst interleaving techniques. For example, the inner interleaving of Hamming code and/or pilot symbols, when implemented for the 400G-ZR standard, needs to be tolerant to phase noise error between pilot symbols, with varying SNR on XI/XQ/YI/YQ components. To address phase noises, a third interleaving process is performed after mapping data into QAM16 symbols. For the data transmission system to have a burst tolerance of at least 1000 bits, the inner interleaving block is implemented to ensure that bursts at output of inner decoder are spread sufficiently over staircase blocks. The cost of performing inner interleaving process is adding a latency of up to about 140 ns at transmitter and receiver.

Figure 9:
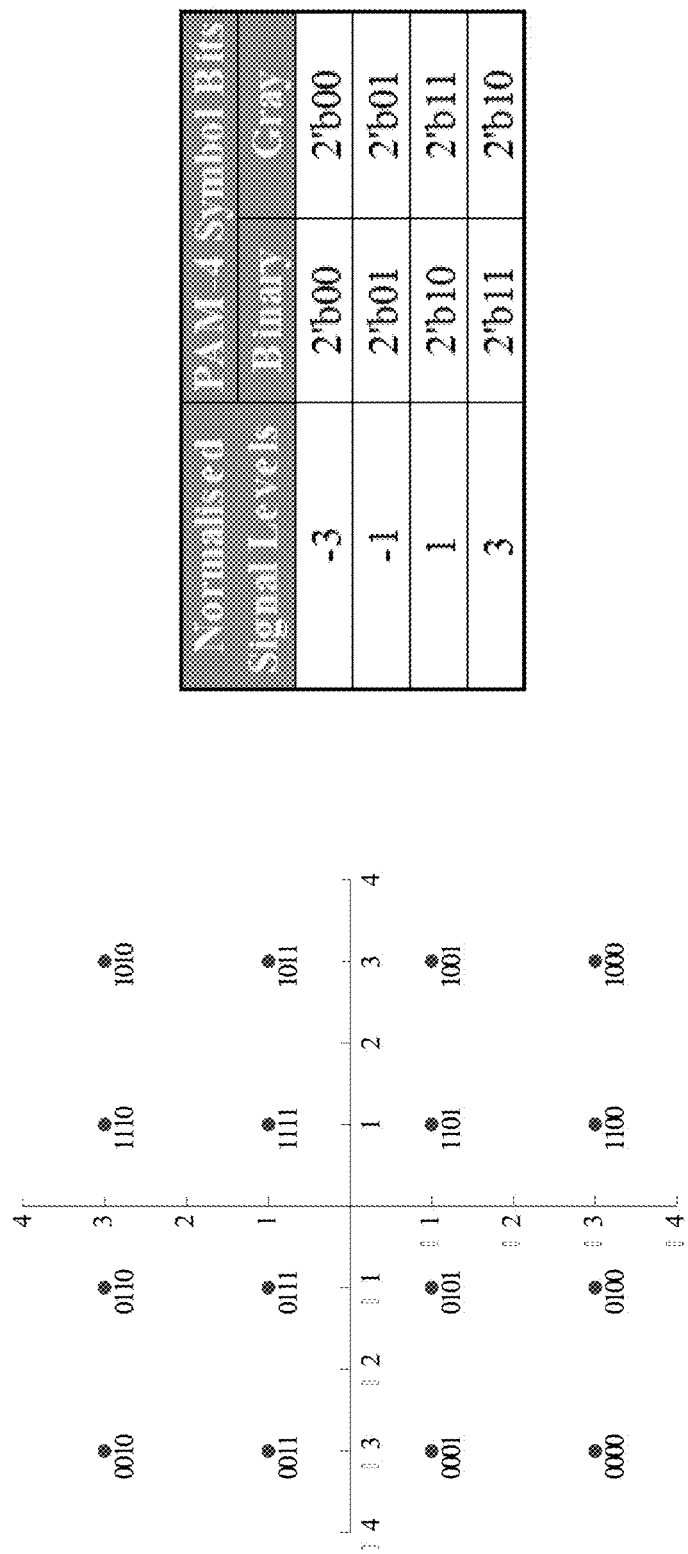
FIG. 9 is a simplified diagram illustrating an exemplary QAM16 Gray mapping scheme according to embodiments of the present invention.

Now referring back to FIG. 5. Data symbols, after hard-decision SC FEC encoding and soft-decision Hamming FEC encoding processes are performed, are mapped into complex symbols. The Gray Mapping block converts encoded data symbols into complex QAM symbols. FIG. 9 is a simplified diagram illustrating an exemplary DP-QAM16 Gray mapping scheme according to embodiments of the present invention. For example, mapping of 4-bits data into a constellation is shown on the left. The table on the right side of FIG. 8 shows normalized signal levels and corresponding symbol bits.

In various embodiments, pilot symbols are inserted into data blocks after encoding and Gray mapping, but before transmission of 64 symbols column from the inner interleaver.

After mapping data to DP-QAM16 symbols, a third interleaving process is performed to address phase noise issues. Among other things, to ensure that Hamming codewords see a uniform channel (with respect to the UI between pilot symbols), each Hamming codeword is mapped to 16 DP-QAM16 symbols. The symbols of 4 Hamming codewords are distributed in a round-robin order. For example, there are 64 unit intervals (UI) between pilot symbols, and 4 rows of the 512×128 bit arrays are need to form 64 dual-polarized QAM16 symbols (DP-QAM16). Correspondingly, to form the 64 inter-pilot symbols, the pilot insertion block reads 4 consecutive rows from the 512×128 memory array and maps each row to 128/8=16 DPQAM16 symbols (via Gray-mapping of blocks of 8 consecutive bits). Through round-robin, DP-QAM16 symbols are distributed from 4 rows to the line side. After every block of 64 UI, a DP-QAM16 pilot symbol is inserted into a coded frame. In a specific embodiment, pilot symbols are of length 512/4=128 bits. Once pilot symbol synchronization has been achieved (i.e., the "framing" for the Hamming code words is embedded into the pilot symbols), the pilot symbols are locked to the boundary of the inner interleaver.

Figure 10:
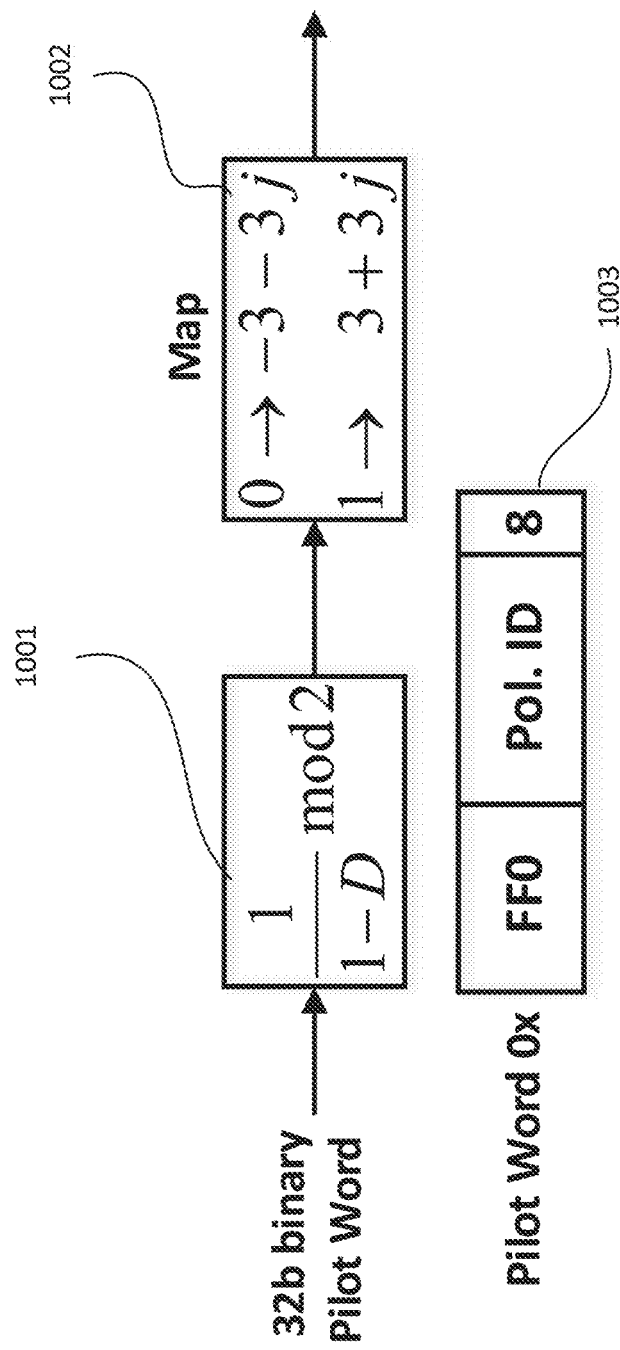
FIG. 10 is a simplified diagram illustrating pilot symbols generation and insertion according to embodiments of the present invention.

In various embodiments, 32-bit pilot sequences are encoded and mapped to outer constellation points. FIG. 10 is a simplified diagram illustrating pilot sequence generation and insertion according to embodiments of the present invention. This diagram is merely an example, which should not unduly limit the scope of the claims. One of ordinary skill in the art would recognize many variations, alternatives, and modifications. Pilot sequences that include a predetermined string of data are differentially encoded at block 1001 and mapped to outer constellation points at block 1002. For example, synchronization based on pilot symbols is performed before phase recovery. A self-coherent and simple scheme can be used to synchronize Hamming codes. It is to be appreciated that the use of pilot symbols in conjunction with Hamming encoding can effectively improve frequency offset acquisition and tracking. For example, with the use of pilot symbols, the encoder state is reset to 0 to resolve phase ambiguity. Block 1003 shows an exemplary pilot sequence. As shown, a 32-bit pilot sequence has a prefix of "FF0" in hexadecimal value, and a suffix of "8" in hexadecimal value. The middle segment of the pilot sequence is filled with predetermined polarization identification code. For example, for X polarization, the corresponding pilot sequence is "0xFF0E6638", and for Y polarization, the corresponding pilot sequence is "0xFF0A80A8". By using the format of a pilot sequence shown in block 1003, pilot symbols can be easily synchronized with Hamming codes. The polarization identification code helps detect and avoid polarization collision. As mentioned above, pilot symbols also ensure that the differential encoder goes back to state "0" at the end of a 32-bit pilot symbol.

It is to be appreciated that data transmission systems according to embodiments of the present invention provide significant and meaningful performance improvement, which is achieved through use of concatenated FEC encoding, FEC interleaving, inner FEC encoding with Hamming code, and pilot symbols.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for data transmission by a transmission apparatus, the method comprising:
   receiving a data stream;
   performing staircase forward error correction (FEC) to encode the data stream and generate a plurality of staircase coded blocks;
   generating outer code frames, each of the outer code frames comprising a coded section and an uncoded section;
   interleaving the staircase coded blocks into coded sections of the outer code frames, burst errors being associated with staircase coded blocks being spread during the interleaving, each of the coded sections comprising a plurality of staircase blocks;
   interleaving the outer code frames to interleaved units with a predetermined size;
   performing Hamming encoding to generate Hamming codewords, the Hamming codewords being spaced by the interleaved units to form concatenated data;
   mapping the concatenated data to quadrature-amplitude modulation (QAM) data symbols;
   interleaving mapped Hamming codewords in a round-robin order into the QAM data symbols;
   inserting pilot symbols into the QAM data symbols; and
   transmitting data associated with the QAM data symbols to a receiver.

2. The method of claim 1 wherein each of the Hamming codewords is mapped to 16 DP-QAM16 symbols.

3. The method of claim 1 further comprising inserting sync words into coded sections of the outer code frames.

4. The method of claim 1 further comprising inserting padding bits into the uncoded sections of the outer code frames.

5. The method of claim 1 wherein the staircase coded blocks are interleaved using an error de-correlator.

6. The method of claim 1 further comprising interleaving Hamming codewords with a convolutional interleaver.

7. The method of claim 1 wherein the pilot symbols are distributed according to polarization.

8. The method of claim 1 further wherein the predetermined size is 119 bits or 120 bits.

9. The method of claim 1 wherein the QAM data symbols comprise dual-polarized (DP)-QAM16 symbols.

10. The method of claim 1 wherein the code sections comprise payload data and parities.

11. The method of claim 1 wherein the pilot symbols are synchronized with Hamming codewords.

12. The method of claim 1 wherein the staircase FEC comprises a hard-decision FEC.

13. The method of claim 1 wherein the staircase coded blocks are interleaved using a time varying permutation technique.

14. A transmitting apparatus comprising:
   a staircase (SC) encoder for processing a data stream and generating SC coded blocks;
   a framing circuit for generating code frames, each of the code frames comprising a coded section and an uncoded section;
   a first interleaving circuit for distributing SC coded blocks into the coded sections of the code frames, errors associated with staircase coded blocks being spread during the distributing;
   a second interleaving circuit for spreading code frames into interleaved units;
   a Hamming encoder for generating Hamming codewords and inserting the Hamming codewords into interleaved units to form concatenated data;
   a mapping circuit for mapping the concatenated data into QAM symbols, the Hamming codewords being mapped into Hamming QAM symbols;
   a third interleaving circuit for distributing the Hamming QAM symbols;
   a pilot symbol circuit for generating pilot symbols and inserting pilot symbols into the QAM symbols, the pilot symbols being synchronized with Hamming QAM symbols; and
   a transmitter for sending data associated with the pilot symbols to a receiver.

15. The apparatus of claim 14 wherein the framing circuit is configured to insert padding bits into the uncoded sections of the code frames.

16. The apparatus of claim 14 wherein the SC encoder comprises a hard-decision encoder.

17. The apparatus of claim 14 wherein the first interleaving circuit comprises an error decorrelator.

18. The apparatus of claim 14 wherein the second interleaving circuit comprises a convolutional interleaver.

19. The apparatus of claim 14 wherein the first interleaving circuit is configured to compute time varying permutation.

20. The apparatus of claim 14 wherein the third interleaving circuit is configured to distribute the Hamming QAM symbols in a round-robin order.

21. The apparatus of claim 14 wherein the mapping circuit is configured to perform Gray mapping.

22. The apparatus of claim 14 wherein the SC encoder is compatible with ITU G.709 protocol.

23. The apparatus of claim 14 wherein the Hamming encoder performs Hamming (128, 119) encoding or Hamming (128, 120) encoding.

24. The apparatus of claim 14 further comprising an optical module for transmitting the QAM data symbols over optical channels.

25. A transmitting apparatus comprising:
   a communication interface for receiving a data stream;
   an alignment circuit for aligning the data stream;
   a Reed-Solomon (RS) decoder for removing RS code from the data stream;
   a staircase (SC) encoder for processing data stream and generating SC coded blocks;
   a framing circuit for generating code frames, each of the code frames comprising a coded section and an uncoded section;
   a first interleaving circuit for distributing SC coded blocks into the coded sections of the code frames, burst errors associated with staircase coded blocks being spread during the distributing SC coded blocks;
   a second interleaving circuit for spreading code frames into interleaved units, positions of correlated errors being randomized by the second interleaving circuit during spreading code frames;
   a Hamming encoder for generating Hamming codewords and inserting the Hamming codewords into interleaved units to form concatenated data;
   a mapping circuit for mapping the concatenated data into QAM symbols;
   a third interleaving circuit for distributing the Hamming codewords into the QAM symbols;
   a transmitter for sending data associated with QAM symbols to a receiver.

26. The apparatus of claim 25 wherein the RS decoder is compatible with IEEE 802.3bs standard.

27. The apparatus of claim 25 wherein the RS decoder is configured to remove RS parity data.

* * * * *